US008044352B2

(12) United States Patent
Hosoya et al.

(10) Patent No.: US 8,044,352 B2
(45) Date of Patent: Oct. 25, 2011

(54) ELECTRON MICROSCOPY

(75) Inventors: Kotaro Hosoya, Hitachinaka (JP); Yoshihiko Nakayama, Hitachinaka (JP); Isao Nagaoki, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 270 days.

(21) Appl. No.: 12/392,732

(22) Filed: Feb. 25, 2009

(65) Prior Publication Data
US 2009/0242792 A1    Oct. 1, 2009

(30) Foreign Application Priority Data

Mar. 31, 2008    (JP) .................................. 2008-089194

(51) Int. Cl.
*H01J 37/28*    (2006.01)
*H01J 37/244*    (2006.01)
(52) U.S. Cl. ........................................ 250/310; 250/397
(58) Field of Classification Search .................. 250/306, 250/307, 310, 311, 397
See application file for complete search history.

(56) References Cited

U.S. PATENT DOCUMENTS

| | | | | |
|---|---|---|---|---|
| 3,329,813 A | * | 7/1967 | Hashimoto | 250/310 |
| 3,597,607 A | * | 8/1971 | Campbell et al. | 250/307 |
| 4,897,545 A | * | 1/1990 | Danilatos | 250/310 |
| 5,578,823 A | | 11/1996 | Taniguchi | |
| 6,194,719 B1 | * | 2/2001 | Mooney et al. | 250/311 |
| 7,105,816 B2 | | 9/2006 | Kamiya et al. | |
| 7,732,762 B2 | * | 6/2010 | Nijkerk et al. | 250/310 |

FOREIGN PATENT DOCUMENTS

| | | |
|---|---|---|
| JP | 08-222169 A1 | 8/1996 |
| JP | 11-273608 A | 10/1999 |
| JP | 2000-057987 A | 2/2000 |
| JP | 2000057987 A * | 2/2000 |
| JP | 2002-110079 A | 4/2002 |
| JP | 3776887 B2 | 3/2006 |
| WO | WO 00/19482 A1 | 4/2000 |

* cited by examiner

*Primary Examiner* — Jack Berman
(74) *Attorney, Agent, or Firm* — Miles & Stockbridge P.C.

(57) ABSTRACT

Using, as a detector, a CCD detector having a CCD element to which a scintillator is closely fixed, a backscattered or scanning transmission image is obtained by the following method. The detector is disposed directly under an objective lens to obtain the backscattered electron image. When one point of a specimen is irradiated with an electron beam, backscattered or transmission electrons generated from the specimen collide with the scintillator to form a luminescent pattern. This pattern is detected by the CCD detector, and stored in a memory. This processing is sequentially repeated for each irradiation position to obtain all the patterns in an electron beam scanning range. Arithmetic processing is performed on each pattern to convert it into an image. Usually, image data for one pixel is calculated from one pattern. By sequentially repeating this, a backscattered or transmission electron image in the electronic beam scanning range can be obtained.

8 Claims, 8 Drawing Sheets

After processing background

Irradiation position A

Irradiation position B  Comparison

ELECTRON MICROSCOPY

BACKGROUND OF THE INVENTION

1. Field of the Invention

The present invention relates to an electron microscopy employing a CCD detector in order to acquire a backscattered electron image, a transmission electron image, or a scanning transmission electron image.

2. Description of the Related Art

When an electron beam enters a specimen in an electron microscopy, a part of the electron beam is scattered at a large angle by an atom in the specimen. Then, the scattered electron beam discharges electrons (backscattered electrons) from the surface of the specimen while losing little energy. Another part of the electron beam discharges electrons (transmission electrons) behind the specimen, without being absorbed in the specimen.

The backscattered electrons can be mainly classified into two types: high angle backscattered electrons scattered at high angles from the surface of the specimen and low angle backscattered electrons scattered at low angles from the surface of the specimen. The high angle backscattered electrons mainly have information on composition distribution, while the low angle backscattered electrons mainly have information on depression and projection. By discriminating these two types of backscattered electrons from each other, higher composition contrast and higher depression and projection contrast can be obtained.

For example, elastically scattered electrons having energy equal to that of the incident electron beam are mainly scattered at high angles, have information on the vicinity of the surface of the specimen, and include little information on the inside of the specimen. Therefore, a surface composition image of comparatively high resolution can be obtained by discriminating and detecting only the electrons scattering at high angles.

Various methods are used as the method for such discrimination, including: a method of colliding backscattered electrons with an electrode for low angle and an electrode for high angle, respectively, converting the backscattered electrons into secondary electrons, and detecting the secondary electrons; a method of selectively detecting high angle backscattered electrons and low angle backscattered electrons by use of an aperture; and a method of emphasizing stereoscopic effects by dividing a detecting face of a backscattered electron detector into two to five, and calculating a signal between each of the divided detecting faces.

On the other hand, the information on the inside of the specimen is reflected in a scanning transmission electron image (STEM image). The information in the STEM image is classified into a bright field image and a dark field image in accordance with a scattering angle of the transmission electron. A bright field image signal includes information on density of the specimen and information on electron diffraction. In the case of the dark field image, different information is visualized depending on a detected angle. Since a heavier element causes the transmission electrons to scatter at larger scattering angles, a difference of the atomic number of the specimen can be visualized. For this, discrimination of the bright field from the dark field is important. Discrimination of the bright field from the dark field has been conventionally performed using a selected area aperture.

For example, WO2000/19482 has disclosed a method of converting low angle backscattered electrons into secondary electrons, and detecting the secondary electrons while attaining a short working distance. Japanese Patent Application Publication No. 2002-110079 has disclosed a method of adding low angle backscattered electrons, high angle backscattered electrons, which are discriminated from each other and detected, and the secondary electrons at any selected ratio. Japanese Patent Application Publication No. Hei 11-273608 has disclosed a method of selectively detecting high angle backscattered electrons and low angle backscattered electrons using an aperture. Additionally, Japanese Patent No. 3776887 has disclosed a method of changing a range of the scattering angles of the transmission electrons to be detected, by making a position of a transmission electron detector variable.

SUMMARY OF THE INVENTION

Discrimination of the backscattered electrons or the transmission electrons has been performed with such conventional methods. However, such conventional methods cannot offer sufficient discrimination, and can no longer meet needs for an analysis in recent years.

An object of the present invention is to provide a detector that can perform discrimination of backscattered electrons or transmission electrons with more accuracy, and can detect the backscattered electrons or the transmission electrons as needed by an observer.

Using, as a detector, a CCD detector having a CCD element to which a scintillator is closely fixed, a backscattered electron image or a scanning transmission image is obtained by the following method.

The detector is disposed directly under an objective lens to obtain the backscattered electron image. The detector has a structure thin enough to be mounted between the objective lens and a specimen. When one point of the specimen is irradiated with an electron beam, backscattered electrons generated from the specimen collide with the scintillator, thus causing the scintillator to emit light, so that a luminescent pattern is formed on the scintillator. The CCD detector detects this pattern and stores the pattern in a memory as data. This processing is sequentially repeated for each of irradiation positions to acquire all the patterns in an electron beam scanning range.

Next, arithmetic processing is performed on each of the acquired patterns to convert it into an image. Usually, image data for one pixel is calculated from one pattern. The backscattered electron image in the electron beam scanning range can be obtained by sequentially repeating this arithmetic processing. Distribution of scattering angles of the backscattered electrons is reflected in a shape of the pattern, while the number and energy of the detected backscattered electrons are reflected in luminance. Accordingly, the backscattered electron image in any selected scattering angle range can be easily obtained by extracting and integrating only the data in the selected region on the pattern.

In the case of the scanning transmission image, the scanning transmission electron image in any selected scattering angle arbitrary range can be similarly obtained by disposing the detector under the specimen.

According to the present invention, discrimination of the backscattered electrons and the transmission electrons can be performed at any scattering angle. Accordingly, it is possible to obtain the backscattered electron image and the scanning transmission electron image on the basis of discrimination at appropriate scattering angles even when thickness, inclination, and composition of the specimen are changed. Thereby, the backscattered electron image or the scanning transmission electron image can be obtained as needed by the observer.

Furthermore, once a pattern is acquired, an image having any changed discrimination angle can be obtained from the pattern by calculation. Consequently, it is unnecessary to take the data again, and operability thus improves.

DESCRIPTION OF THE PREFERRED EMBODIMENTS

Hereinafter, with reference to the drawings, an embodiment of the present invention will be described in detail.

Figure 1:
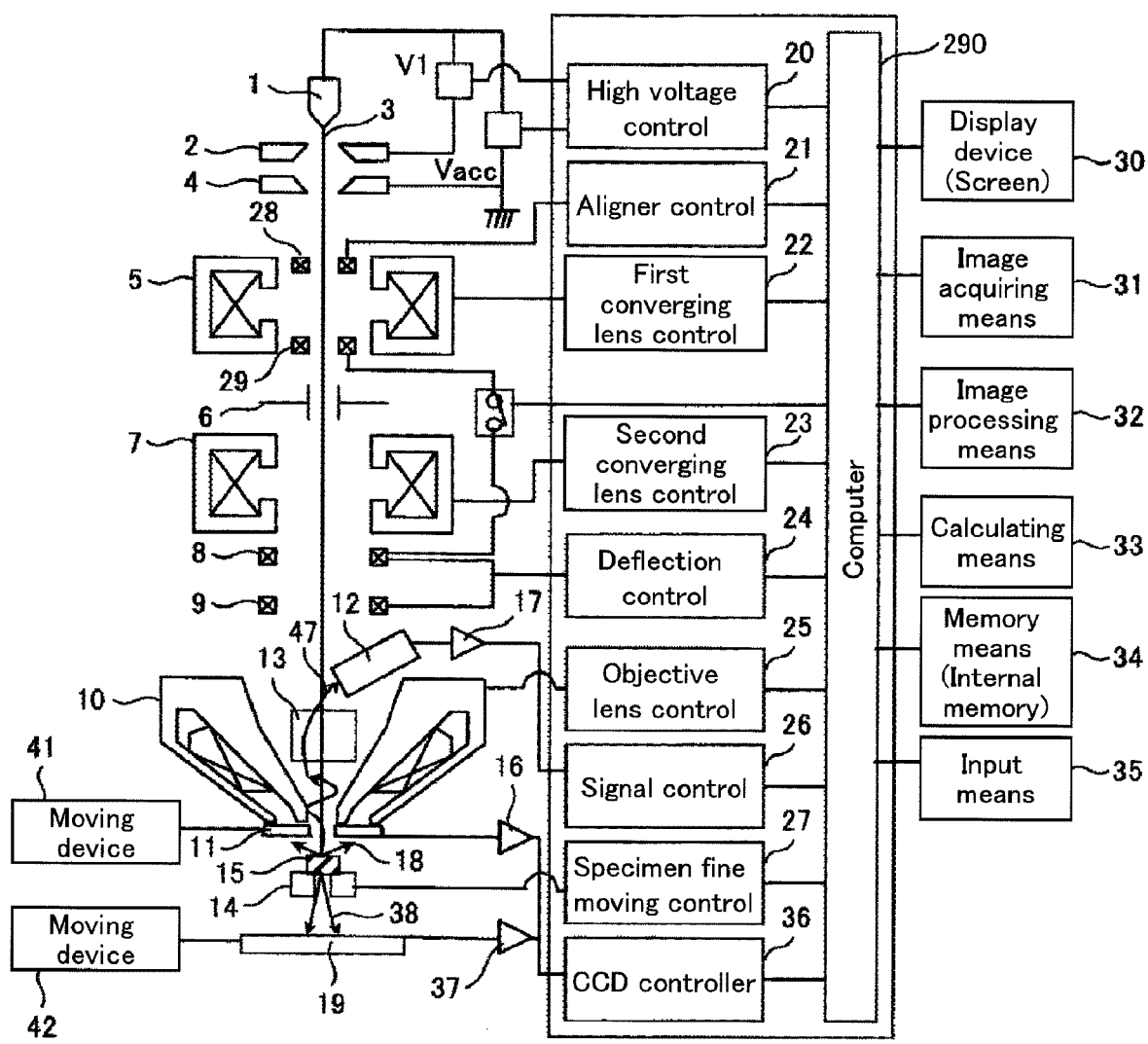
FIG. 1 is an explanatory view showing an embodiment of the present invention.

FIG. 1 is a schematic diagram of the embodiment of the present invention.

A primary electron beam 3 is discharged from a cathode 1 by a voltage V1 applied to the cathode 1 and a first electrode 2, and is accelerated by a voltage Vacc applied to a second electrode 4 to advance to an electromagnetic lens system at a rear stage.

The acceleration voltage Vacc and the V1 are controlled by a high voltage control circuit 20. The primary electron beam 3 is converged by a first converging lens 5 controlled by a first converging lens control circuit 22. Here, the specimen irradiation current of the primary electron beam 3 is restricted by an objective lens aperture 6. In order for the center of the electron beam to pass through a hole center of the objective lens aperture 6, an electron-beam center-axis adjustment aligner 28, an aligner control circuit 21, and an electron beam center adjustment deflector 29 for scanning the electron beam on the objective lens aperture 6 are provided.

Then, the primary electron beam 3 is converged again by a second converging lens 7 controlled by a second converging lens control circuit 23, and narrowly focused onto a specimen 15 by an objective lens 10 controlled by an objective lens control circuit 25. Furthermore, the specimen 15 is two-dimensionally scanned by an upper deflecting coil 8 and a lower deflecting coil 9 connected with a deflection control circuit 24.

The specimen 15 is placed on a specimen fine moving device 14 controlled by a specimen fine moving control circuit 27. Backscattered electrons 18, which have comparatively higher energy among signals generated from a primary electron beam irradiation point of the specimen 15, are detected by a backscattered electron detector 11, and are amplified by an amplifier 16. Moreover, secondary electrons 47 having lower energy are wound up by a magnetic field of the objective lens 10. The secondary electrons 47 are detected by a secondary electron detector 12, while deviation of an optical axis of the primary electron beam 3 is prevented by a crossed electromagnetic field (E×B) unit 13 disposed above the objective lens 10. Then, the secondary electrons 47 are amplified by an amplifier 17.

Transmission electrons 38 that transmit through the specimen 15 are detected by a transmission electron detector 19, and amplified by an amplifier 37. The amplifier 17 is controlled by a signal control circuit 26, and the amplifiers 16 and 17 are controlled by a CCD controller 36. The various control circuits 20 to 27 and the CCD controller 36 are controlled by a computer 290 that controls the whole apparatus. A signal of the amplified backscattered electrons is shown on a screen of a display unit 30 as an enlarged image of the specimen. In addition, the computer 290 is connected with an image acquiring means 31 for acquiring an observed image displayed on the display unit 30 as image information, an image processing means 32 for performing various kinds of image processing on the observed image, a calculating means 33 for performing various calculations on the basis of a result of the image processing, a memory 34 for storing the observed image and the calculation results, and an input means 35 for inputting observation conditions or the like.

Figure 2:
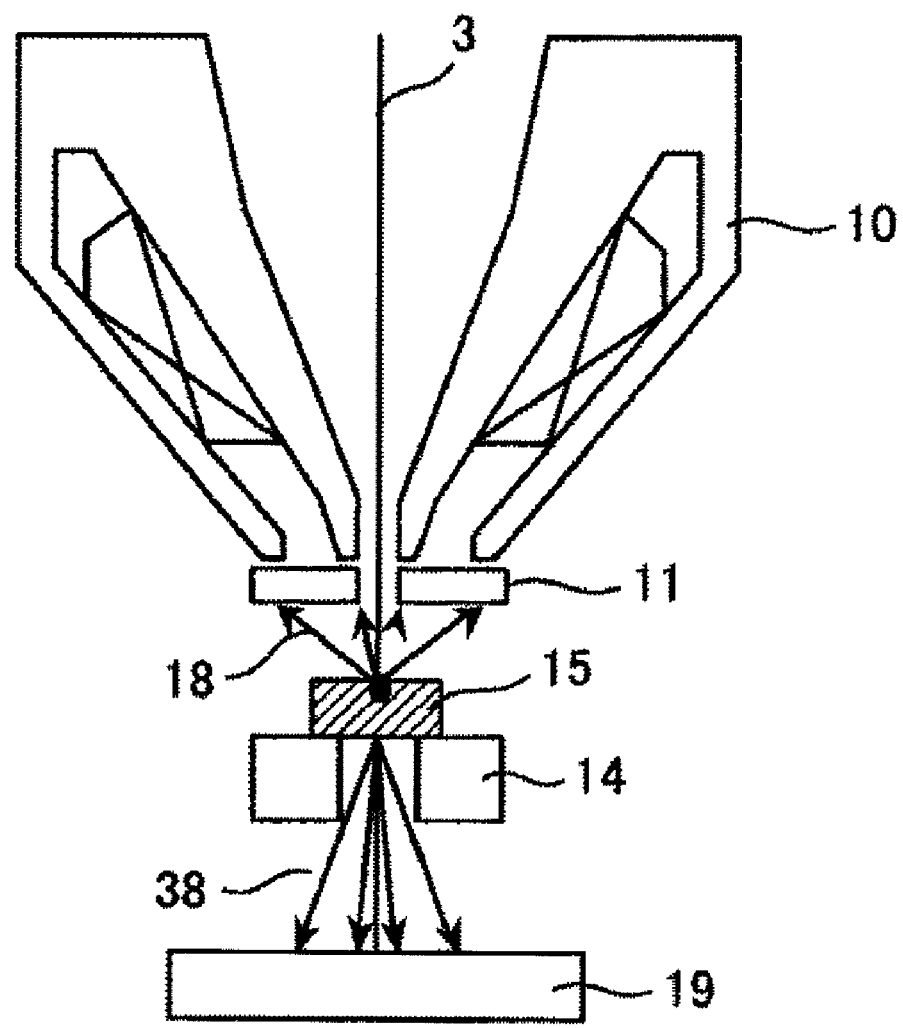
FIG. 2 is an explanatory view of backscattered electrons and transmission electrons.

FIG. 2 shows scattering of the backscattered electrons 18 and the transmission electrons 38. Contrast of composition information on the specimen is intensely detected from the backscattered electrons 18 the reflection angles of which from a specimen surface are in a high range, while contrast of depression and projection information is intensely detected from the backscattered electrons 18 the reflection angels of which are in a low range.

In the conventional method, a scintillator, a semiconductor, or a metal electrode that converts backscattered electrons into secondary electrons is used as a detector for discriminating and detecting the low angle backscattered electrons and the high angle backscattered electrons. However, it is difficult for the detector to have a multi-divided structure in any of the above-mentioned cases. Generally, the detector has a two-divided structure. Since a threshold of the scattering angle for discrimination is determined by the structure of the detector, a threshold cannot be selectively set.

It is also impossible to extract only the backscattered electrons in a selected range of the scattering angles, not even by using an aperture. Since a threshold and a range of extracted angles for discrimination are determined by a diameter of the aperture, the threshold and the range of extracted angles cannot be selectively set. The scattering angle of the backscattered electron changes depending on inclination and composition of the specimen. However, a scattering angle for detection cannot be appropriately set with the conventional method. Accordingly, accurate discrimination is difficult.

In the present invention, the deflection controlling circuit 24 is controlled in synchronization with control of the CCD backscattered electron detector 11. Thereby, a pattern image of the backscattered electrons is detected for each irradiation point (irradiation position) of the electron beam by the CCD backscattered electron detector 11, and recorded in the memory 34.

Figure 3:
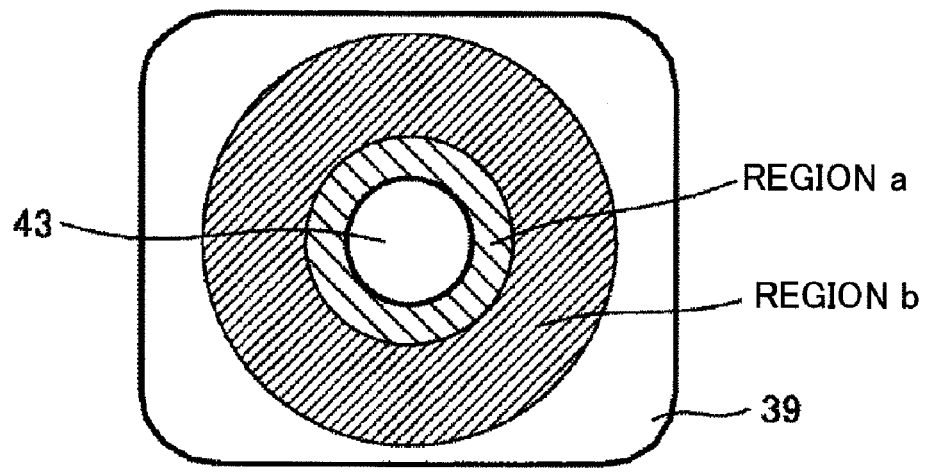
FIG. 3 shows a backscattered electron pattern image.

FIG. 3 shows an example of a backscattered electron pattern image 39. This backscattered electron pattern image 39 corresponds to one pixel of an enlarged image. The image processing means 32 and the calculating means 33 are used to integrate or average only information on a region a of the backscattered electron pattern image 39, and data for one pixel is obtained. By performing this processing on each backscattered electron pattern image 39 obtained from each irradiation point of the electron beam, an image of only the high angle backscattered electrons is obtained. Similarly, an enlarged image formed only on the basis of information on a region b is an enlarged image of only the low angle backscattered electrons.

After the backscattered electron pattern image 39 of the specimen surface to be observed is thus recorded, by designating any selected region on the pattern, the designated region on the pattern can be converted into a high angle backscattered electron image or a low angle backscattered electron image. An arbitrary region can also be designated by use of a component element or inclination of the specimen.

Figure 6:
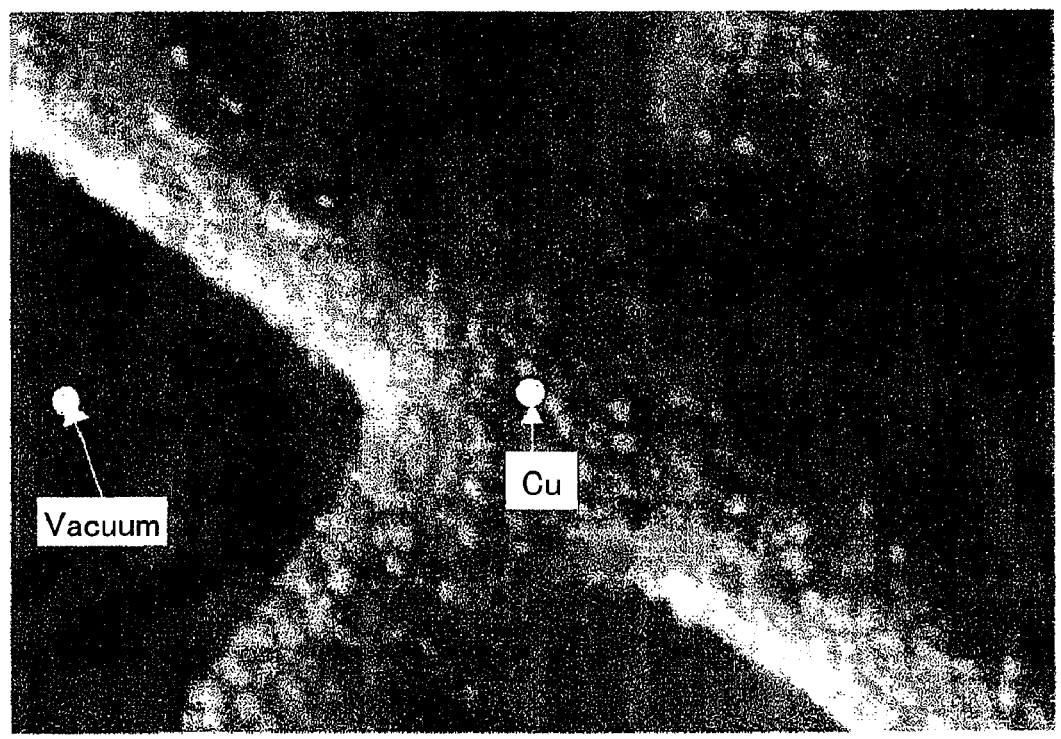
FIG. 6 shows a scanning electron microscopic image of a copper mesh.
Figure 7:
FIG. 7 is a distribution map of electrons detected by irradiation of a charged particle beam in vacuum.
Figure 7:
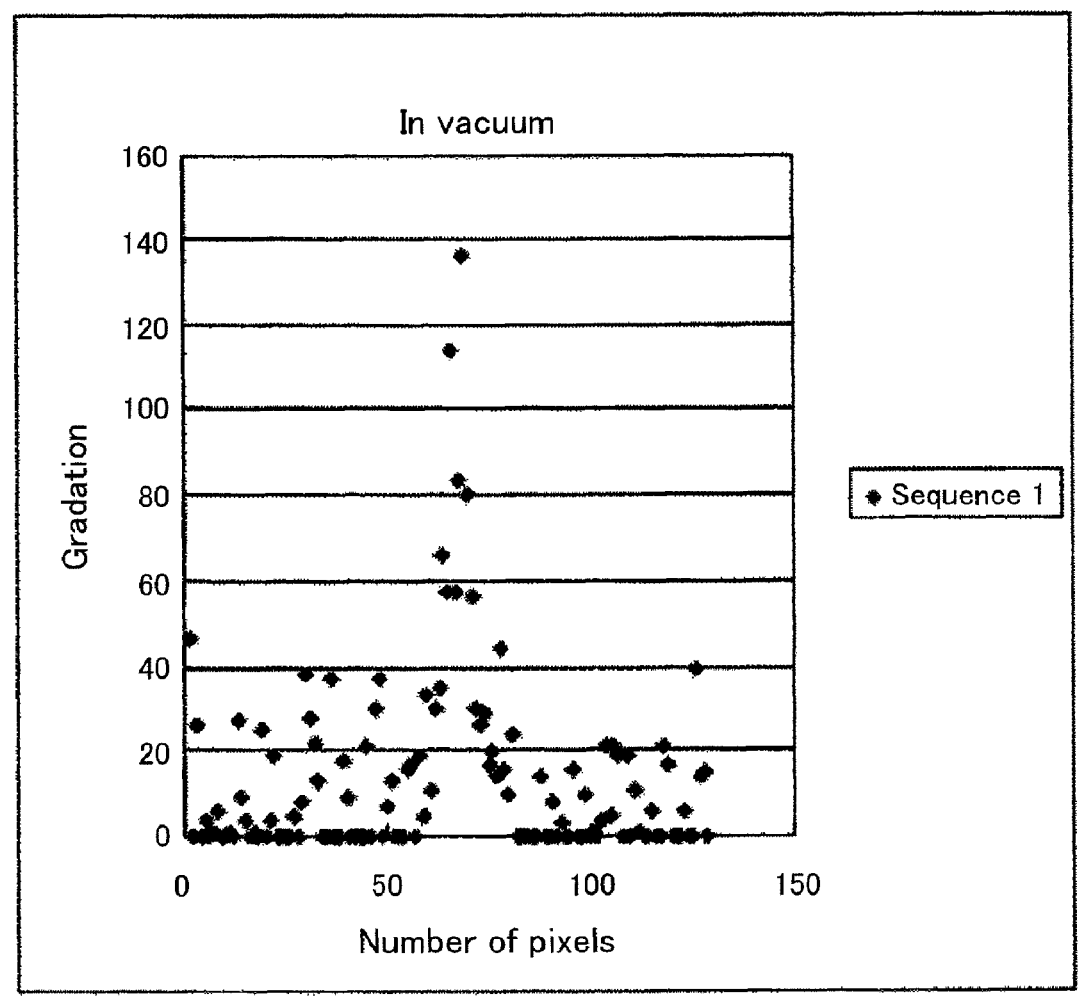
Figure 8:
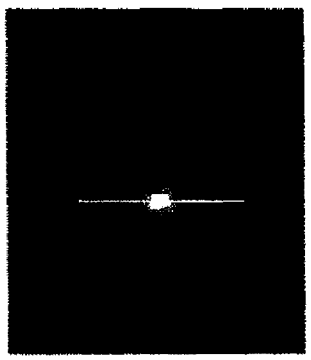
FIG. 8 is a backscattered electron distribution map obtained when irradiating copper with the charged particle beam.
Figure 8:
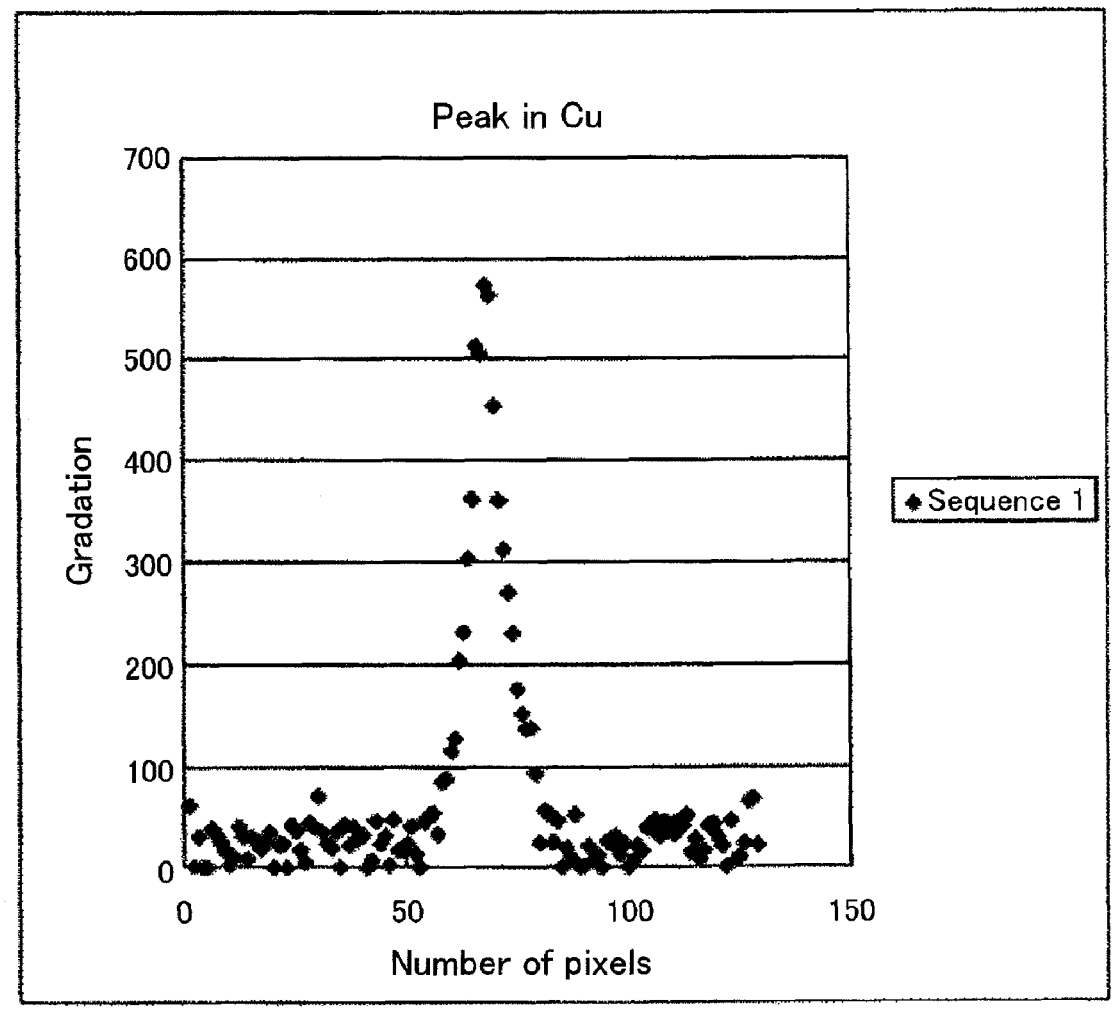

FIGS. 6 to 8 show distribution of a backscattered electron image obtained for each of the irradiation positions, according to the present invention. As shown in FIG. 6, a copper mesh is used as the specimen. FIG. 7 shows a state of distribution of the backscattered electrons which is obtained by the backscattered electron detector when the electron beam is applied in vacuum. The upper diagram shows a distribution image (distribution information) of the backscattered electrons in the irradiation position, and the lower graph shows signal amounts plotted along a white line of the above-mentioned diagram.

FIG. 8 shows a state of distribution of the backscattered electrons which is obtained by the backscattered electron detector when a copper is irradiated with the electron beam. The upper diagram shows a distribution image (distribution information) of the backscattered electrons in the irradiation position, and the lower graph shows signal amounts plotted along a white line of the above-mentioned diagram.

The result of the experiments shows that the above-mentioned spot appears in the same position in spite of shifting the irradiation position when copper exists in the irradiation position.

It turned out that the composition of the irradiation position of the primary electron beam can be identified by using this result of the experiments. Since identification of an incident position is limited to four in a four-divided detector, for example, in the conventional case, the composition cannot be identified even when the composition information is reflected. In the present invention, since distribution information (distribution map) on the backscattered electrons is acquired for every irradiation position, the composition can be accurately identified.

Figure 9:
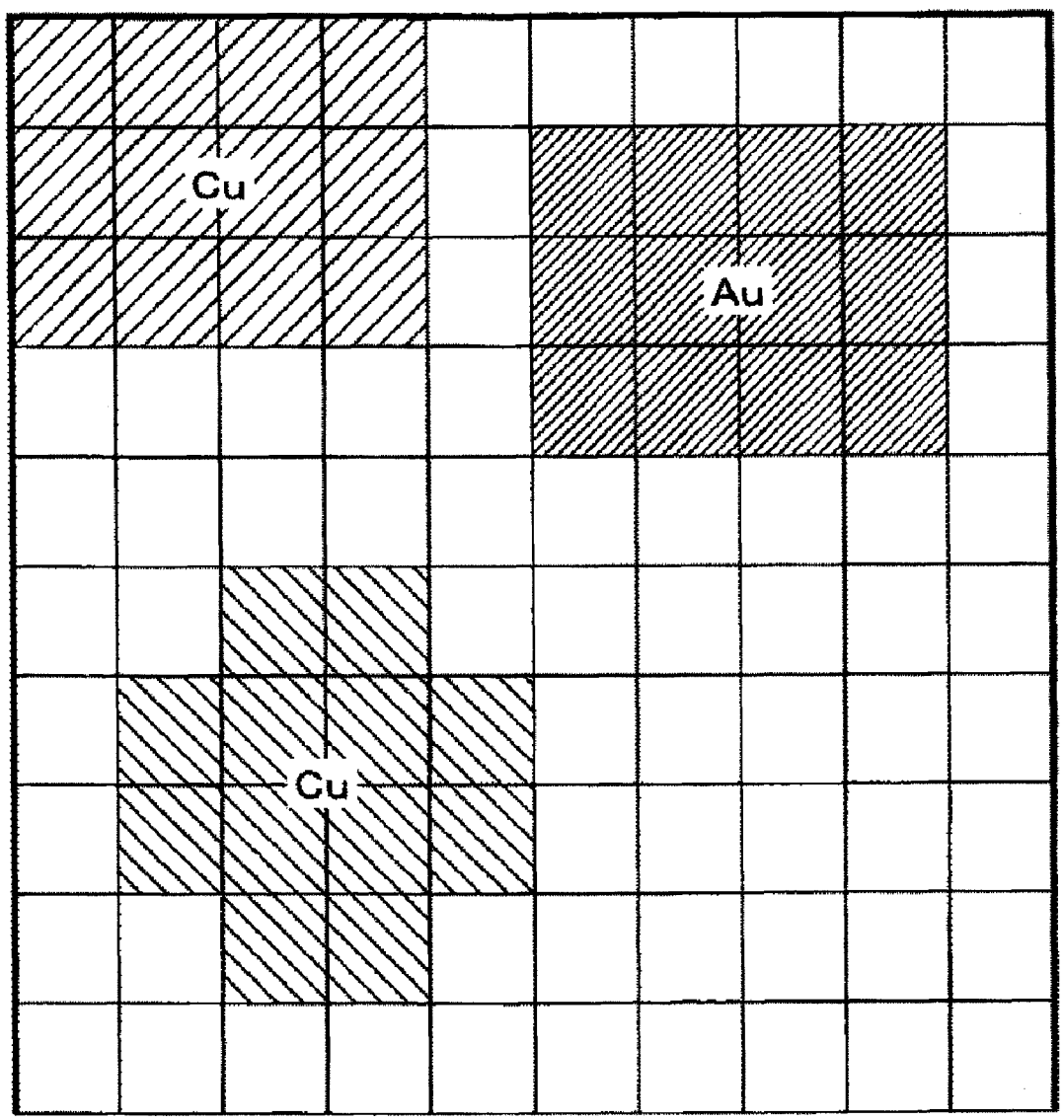
FIG. 9 is a map of composition information.

By retaining information on the spot position of the backscattered electrons in each substance in advance, the composition at each irradiation position can be found. Further, a map on the composition information on the specimen as shown in FIG. 9 can be also created.

FIG. 2 shows scattering of the backscattered electrons 18 and the transmission electrons 38. Density information and electron diffraction information on the specimen 15 are included in a bright field picture signal of the transmission electrons 38 which has a lower scattering angle among the transmission electrons 38 that transmit through the specimen 15. In the case of a dark field image signal of the transmission electrons 38 which has a higher scattering angle, information visualized is different depending on the detection angle. A heavier element causes the transmission electrons 38 to scatter at a higher scattering angle.

Discrimination in accordance with the scattering angle of the transmission electron has the same problem as in the case of the backscattered electron since the scattering angle varies in accordance with the thickness or composition of the specimen. Some types of electron microscopy employ a method of shifting the detector on the optical axis and controlling the angle for detection. Such a method, however, has a problem that a mechanism becomes complicated.

In the present invention, the deflection controlling circuit 24 is controlled in synchronization with control of the CCD backscattered electron detector 11. Thereby, a pattern image of the transmission electron is detected for each irradiation point (irradiation position) of the electron beam by the CCD backscattered electron detector 11, and recorded in the memory 34.

Figure 4:
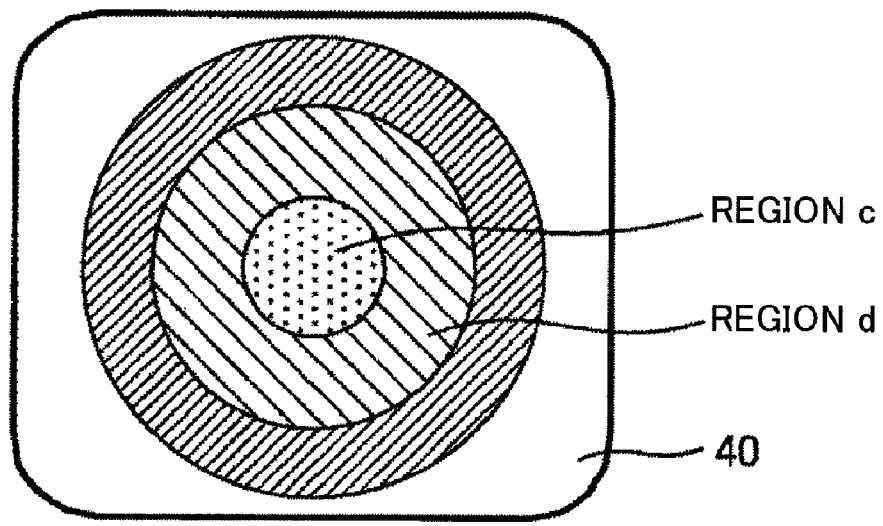
FIG. 4 shows a transmission electron pattern image.

FIG. 4 shows an example of a pattern image 40 of the transmission electrons. This transmission electron pattern image 40 corresponds to one pixel of an enlarged image. The image processing means 32 and the calculating means 33 are used to integrate or average only information on a region c of the transmission electron pattern image 40, and data for one pixel is obtained. The light field image is formed by performing this processing on the transmission electron pattern image 40 obtained from each irradiation point of the electron beam. Similarly, the dark field image is an enlarged image formed only by information on a region d.

It is expected that the contrast of the backscattered electron image or the transmission electron image should be further improved by using discrimination in accordance with luminance of the pattern image in addition to discrimination in accordance with selection of the region in the pattern image.

As mentioned above, variety of information can be acquired by acquiring and storing the distribution information on (distribution image of) the backscattered electrons or the transmission electrons for every irradiation position.

Figure 10:
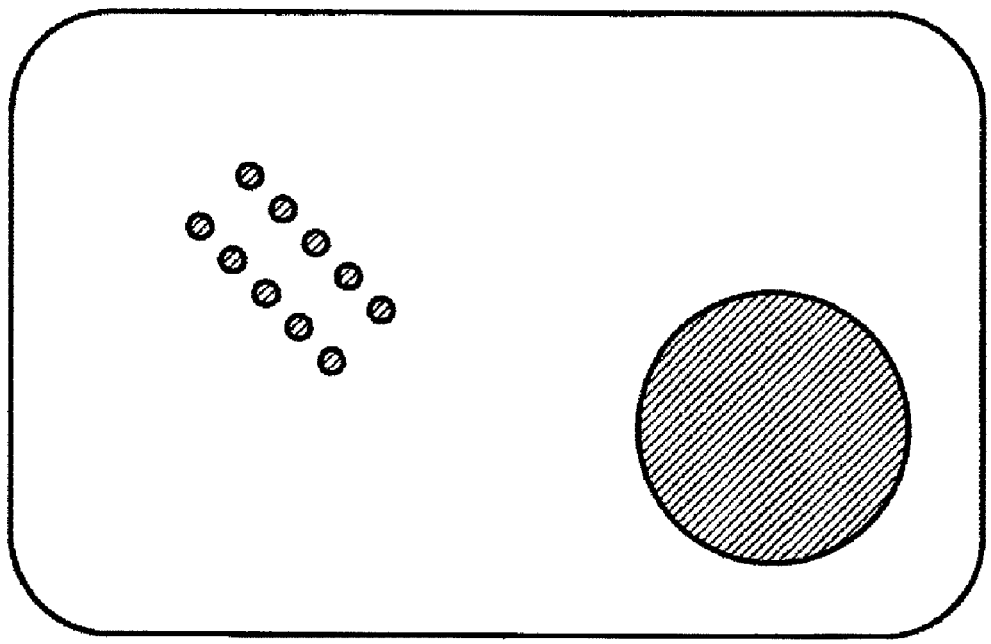
FIG. 10 shows comparison of backscattered electron distribution information or transmission electron distribution information in different irradiation positions.
Figure 10:
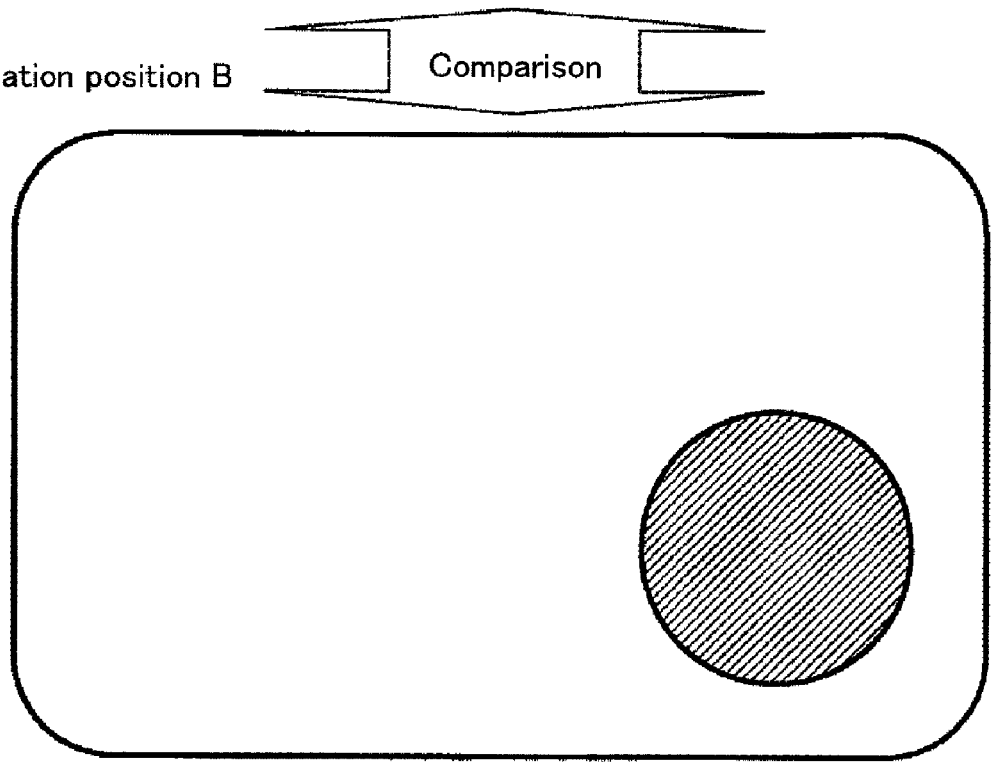

For example, as shown in FIG. 10, the distribution information is observed, only a signal of a detection position that appears in a spot form is extracted, and a signal of a detection position that has a spread region is removed. Thereby, only the composition information can be extracted with the projection and depression information on the specimen being removed. This can be attained by subtracting the information on a region having an area not less than a predetermined value from the distribution image. Conversely, when only the information having an area not less than the predetermined value is extracted, the information other than the composition information can be extracted.

With respect to this point, conventionally, while the backscattered electrons or the transmission electrons enter a divided detecting surface, the backscattered electrons or transmission electrons that enter the same detecting surface are all collected as one signal irrespective of the information (depression and projection information, composition information) that the electron has. For that reason, the composition information and the projection and depression information are mixed, and are detected.

In the present invention, the information that the backscattered electron or the transmission electron has can be isolated with more accuracy.

Furthermore, as shown in FIG. 10, by comparing distribution information (distribution image) for every different irradiation position, only a part common to each distribution image can be extracted, or only the information unique to each distribution image not included in the distribution image of other irradiation position can be extracted.

Figure 5:
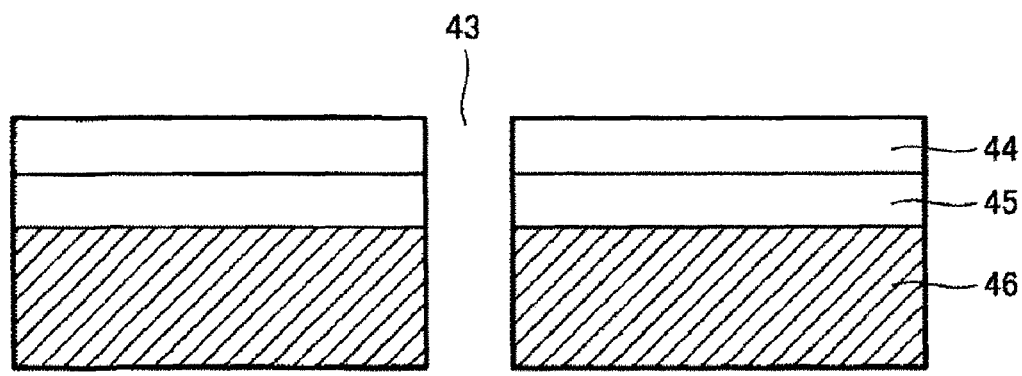
FIG. 5 is a schematic diagram of a structure of a CCD backscattered electron detector.

FIG. 5 is a schematic diagram of a structure of the CCD backscattered electron detector 11.

A scintillator 44 is fixed to a CCD element 46 with a buffer layer 45 in between. An electron beam passing hole 43 for passing the primary electron beam 3 through is provided in a central portion of the detector 11. The number of pixels of the image that can be captured is approximately 1500 to 1700 wide by approximately 1000 to 1200 long.

The CCD backscattered electron detector 11 is disposed between the objective lens 10 and the specimen 15 to acquire the backscattered electron image, and under the specimen 15 to acquire the scanning transmission electron image. The CCD backscattered electron detector 11 measures approximately 40 mm wide by 30 mm long by 5 to 10 mm thick, which is small enough to be mounted on.

In the conventional detector employing the CCD element, the size of the CCD element is approximately 6 μm. For that reason, light generated from the scintillator inevitably enters multiple CCD elements. Accordingly, the light needs to be converged with a lens. The light generated in the scintillator is therefore converged by the lens disposed between the scintillator and the CCD element, and subsequently, the converged light enters the CCD element. Accordingly, the conventional detector employing the CCD element is large-sized, and cannot be disposed between the objective lens and the specimen.

In the present invention, the size of a detection element of the CCD is 20 μm, which is larger than the conventional one. Accordingly, the CCD backscattered electron detector 11 has a structure in which the light discharged from the scintillator 44 is detected without being converged with a lens.

The thickness of the scintillator is determined depending on the size of the CCD element. When the scintillator is too thick, the light spread within the scintillator enters multiple CCD elements, so that accuracy of the incident position deteriorates.

The above-mentioned experiment shows that at least not less than 10 bits of the CCD element is needed in order to obtain accurate observation of the peak as shown in FIG. 8.

The CCD backscattered electron detector 11 may be configured to be movable in an optical axis direction by a moving means 41 according to a purpose. For example, when detecting all dark field signals to be generated, the CCD backscattered electron detector 11 may be brought closer to the specimen 15. Moreover, for example, when a part of the dark field signals is to be discriminated, the CCD backscattered electron detector 11 may be moved away from the specimen 15 so that a discrimination angle can be set finely.

Detection elements, such as CCD elements, that are two-dimensionally arranged (for example, arranged in lattice pattern) and that the incident position of the electron is identifiable therein are used as the detection elements for the detector of the backscattered electron and the transmission electron.

While the above-mentioned embodiment has been described using the CCD detector, the present invention is not limited to this. It is also possible to use a detector of any other form that can identify the incident position of the electron and can be inserted between the specimen and the objective lens. Moreover, it is also possible to use a detector of a type in which multiple detection elements are arranged regularly in a plane (for example, in lattice pattern) for identification of the incident position of the electron.

EXPLANATION OF REFERENCE NUMERALS

1 . . . cathode, 2 . . . first electrode, 3 . . . electron beam, 4 . . . second electrode, 5 . . . first converging lens, 6 . . . objective lens aperture, 7 . . . second converging lens, 8 . . . upper deflecting coil, 9 . . . lower deflecting coil, 10 . . . objective lens, 11 . . . backscattered electron detector, 12 . . . secondary electron detector, 13 . . . crossed electromagnetic-field apparatus, 14 . . . fine moving device, 15 . . . specimen, 16 and 17 . . . amplifier, 18 . . . backscattered electron, 19 . . . transmission electron detector, 20 . . . high voltage control circuit, 21 . . . aligner control circuit, 22 . . . first converging lens control circuit, 23 . . . second converging lens control circuit, 24 . . . deflection controlling circuit, 25 . . . objective lens control circuit, 26 . . . signal control circuit, 27 . . . specimen fine moving control circuit, 28 . . . electron beam central axis adjustment aligner, 30 . . . display device, 31 . . . image acquiring means, 32 . . . image processing means, 33 . . . calculating means, 34 . . . memory, 35 . . . input means, 36 . . . CCD controller, 37 . . . amplifier, 38 . . . transmission electron, 39 . . . backscattered electron pattern image, 40 . . . transmission electron pattern image, 41 . . . moving means, 42 . . . transmission electron detector moving means, 43 . . . electron beam passing hole, 44 . . . scintillator, 45 . . . buffer layer, 46 . . . CCD element, 47 . . . secondary electron, 290 . . . computer,

What is claimed is:

1. A charged particle beam device, comprising:
   a charged-particle source;
   a deflector that scans a specimen with a primary charged particle beam discharged from the charged-particle source;
   an objective lens that converges the primary charged particle beam discharged from the charged-particle source;
   a detector that detects backscattered electrons generated from the specimen by irradiation with the primary charged particle beam, detection elements of the detector being arranged in a plane;
   a memory that stores signals from the detector by associating each irradiation position with corresponding distribution information of the detected backscattered electrons generated at said each irradiation position; and
   a control unit that forms an image from the stored signals from the detector by calculating a value for each pixel of the image
   using a predetermined region of the distribution information of the detected backscattered electrons for the corresponding irradiation position,
   wherein the control unit compares the distribution information for all of the irradiation positions, modifies each distribution information by subtracting a signal common to each distribution information therefrom, and calculates said value for each pixel based on the modified distribution information for the corresponding irradiation position.

2. The charged particle beam device according to claim 1, wherein the detection elements of the detector are arranged in a two-dimensional lattice pattern.

3. The charged particle beam device according to claim 1, wherein
   the control unit selectively acquires a signal that has a detected area not less than a predetermined area or a signal that has a detected area not more than the predetermined area from the distribution information of the detected backscattered electrons generated at each of the irradiation positions, and
   calculates the value for each pixel based on the selected signals.

4. The charged particle beam device according to claim 1, wherein
   the detection elements have a capacity of at least 10 bits.

5. A charged particle beam device comprising:
   a charged-particle source;
   a deflector that scans a specimen with a primary charged particle beam discharged from the charged-particle source;
   an objective lens that converges the primary charged particle beam discharged from the charged-particle source;
   a detector that detects backscattered electrons generated from the specimen by irradiation with the primary charged particle beam;

a memory that stores signals from the detector for each irradiation position on the specimen as a distribution map of the detected backscattered electrons; and a control unit that forms an image of the specimen from the stored signals by calculating a value for each pixel of the image based on a selected region constituting a part of the distribution map of the detected backscattered electrons for a corresponding one of the irradiation positions.

6. The charged particle beam device according to claim 5, wherein the control unit calculates pixel values using the same region in each distribution map.

7. The charged particle beam device according to claim 5, wherein the control unit is configured to select said selected region from among a plurality of regions in each distribution map, said plurality of regions including a first region that corresponds to a region of the detector on which high angle backscattered electrons are incident and a second region that corresponds to a region of the detector on which low angle backscattered electrons are incident.

8. The charged particle beam device according to claim 5, wherein detection elements of the detector are arranged in a plane.

* * * * *